US006185240B1

United States Patent
Jiang et al.

(10) Patent No.: US 6,185,240 B1
(45) Date of Patent: Feb. 6, 2001

(54) SEMICONDUCTOR LASER HAVING ELECTRO-STATIC DISCHARGE PROTECTION

(75) Inventors: Wenbin Jiang, Phoenix; Paul R. Claisse; Philip A. Kiely, both of Gilbert, all of AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/015,896

(22) Filed: Jan. 30, 1998

(51) Int. Cl.$^7$ .................. H01S 3/19; H01S 3/00
(52) U.S. Cl. ........................... 372/50; 372/38
(58) Field of Search .................. 372/38, 50, 96

(56) References Cited

U.S. PATENT DOCUMENTS

| | | | |
|---|---|---|---|
| H322 | * 8/1987 | Simons | 372/38 |
| 4,924,473 | 5/1990 | Burgyan et al. | 372/38 |
| 5,468,656 | 11/1995 | Shieh et al. | 438/32 |
| 5,493,577 | * 2/1996 | Choquette et al. | 372/96 |
| 5,541,443 | * 7/1996 | Lee et al. | 372/50 |
| 5,550,852 | 8/1996 | Patel et al. | 372/33 |
| 5,577,064 | * 11/1996 | Swirhun et al. | 372/50 |
| 5,610,931 | * 3/1997 | Huang | 372/38 |
| 5,990,499 | * 11/1999 | Kuhlmann et al. | 257/99 |

FOREIGN PATENT DOCUMENTS

| | | | |
|---|---|---|---|
| 62-45193 | 2/1987 | (JP) | H01S/3/18 |
| 62-69694 | 3/1987 | (JP) | H01S/3/18 |
| 63-177494 | 7/1988 | (JP) | H01S/3/18 |
| 2-246360 | * 10/1990 | (JP) . | |
| 9-27657 | 1/1997 | (JP) | H01S/3/18 |
| WO 97/37390 | * 10/1997 | (WO) . | |

* cited by examiner

Primary Examiner—Bruce C Anderson
Assistant Examiner—Quyen Leung
(74) Attorney, Agent, or Firm—Eugene A. Parsons; William E. Koch

(57) ABSTRACT

A vertical cavity surface emitting laser (103) and a diode (105) is provided. The diode (105) is electrically coupled in reverse parallel to the vertical cavity surface emitting laser (103), thereby providing a portion of protection against electro-static discharge damage to the vertical cavity surface emitting laser (103).

5 Claims, 1 Drawing Sheet

SEMICONDUCTOR LASER HAVING ELECTRO-STATIC DISCHARGE PROTECTION

FIELD OF THE INVENTION

The present invention pertains, in general, to lasers and, more particularly, to vertical cavity surface emitting lasers.

BACKGROUND OF THE INVENTION

Recently, there has been an increased interest in a new type of laser device called a vertical cavity surface emitting laser (VCSEL). Several advantages of VCSEL devices are apparent, such as having a circular beam, two-dimensional array capability, and allowing wafer scale testing. These advantages are due in part from advances in metal organic vapor phase epitaxy (MOVPE) and molecular beam epitaxy (MBE) that allow monolithic growth of diffractive Bragg reflectors (DBRs) for VCSELs.

However, even with these advantages, VCSEL devices are more susceptible to electro-static discharge (ESD) events because of smaller active volume. Electro-static discharge events are events where a high static charge is built up and subsequently discharged. When the high static charge discharges through a VCSEL, it will be catastrophically damaged. Thus, conventional VCSEL's are limited to applications that are not susceptible to ESD events, which reduces the number of possible applications for VCSEL's.

Thus it is highly desirable and an object of the present invention to provide a protective circuitry to increase the VCSEL ESD damage threshold.

It is another purpose of the present invention to provide for a method to integrate the protective diode with the VCSELs.

SUMMARY OF THE INVENTION

The above problems and others are at least partially solved and the above objects are realized in a semiconductor laser having electro-static discharge (ESD) protection. To provide the ESD protection, a vertical cavity surface emitting laser (VCSEL) is fabricated and a diode is fabricated and connected in parallel reverse orientation to the VCSEL. When a reverse biased ESD event is applied to the VCSEL, the parallel connected diode will provide a very low resistance path to quickly drain off the charge before it can damage the VCSEL. Since the reverse biased ESD damage threshold is typically lower than the forward biased ESD damage threshold, the proposed solution will increase the VCSEL ESD tolerence level to the forward biased ESD damage threshold level. The parallel connected diode is fabricated adjacent and in the same fabrication steps in which the VCSEL is formed. Thus, very little extra chip real estate is required and no extra fabrication steps are required to provide the protection.

DETAILED DESCRIPTION OF THE DRAWINGS

Figure 1:
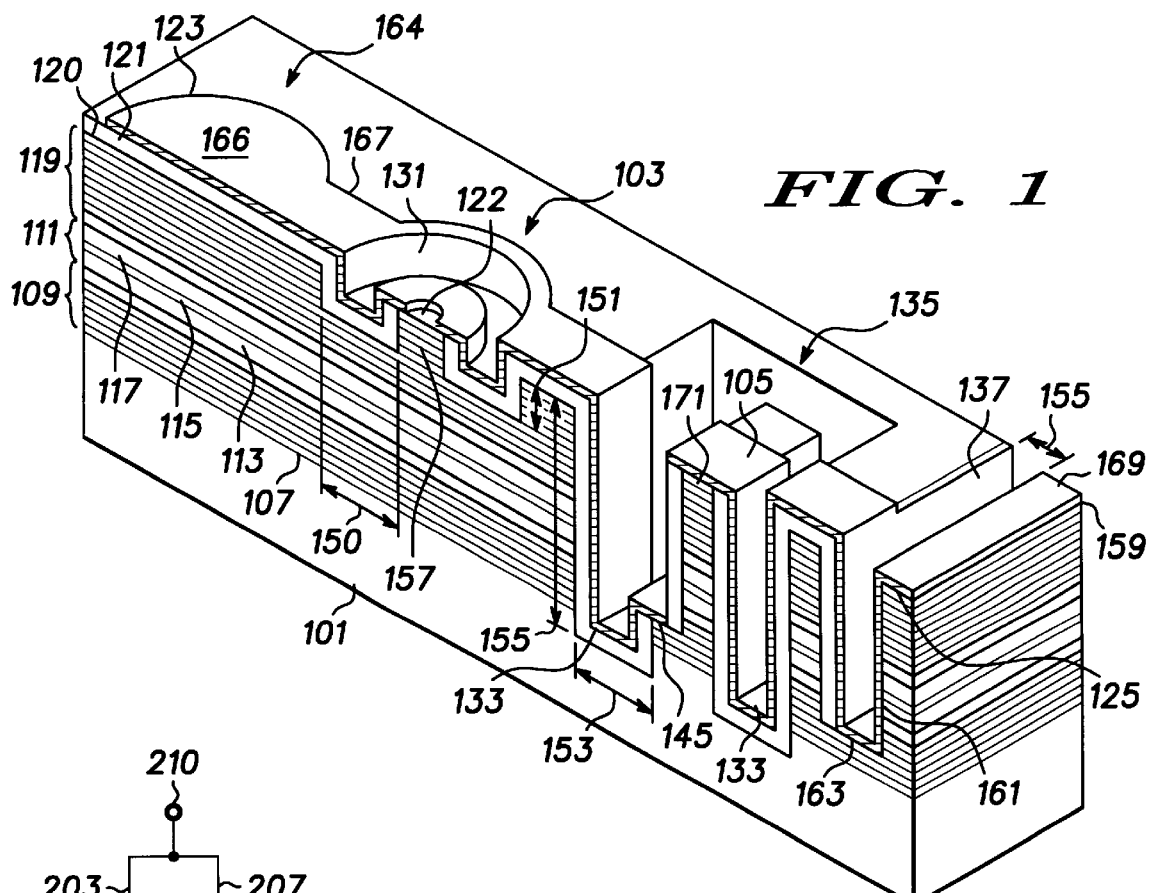
FIG. 1 is an enlarged isometric diagram of a semiconductor substrate having a VCSEL and a diode coupled thereto, wherein the VCSEL and the diode are also shown in section.

FIG. 1 is an enlarged isometric diagram of a semiconductor substrate 101 with a surface 107 having a VCSEL 103 and a diode 105 coupled thereto, wherein VCSEL 103 and diode 105 are also shown in section. VCSEL 103 and diode 105 are made including several features or elements, such as substrate 101, a stack 109 of distributed Bragg reflectors (DBRs), an active area 111 having a cladding region 113, an active region 115, a cladding region 117, a stack 119 of distributed Bragg reflectors (DBRs) having a surface 120, a dielectric layer 121, and conductive layers 123 and 125.

Figure 2:
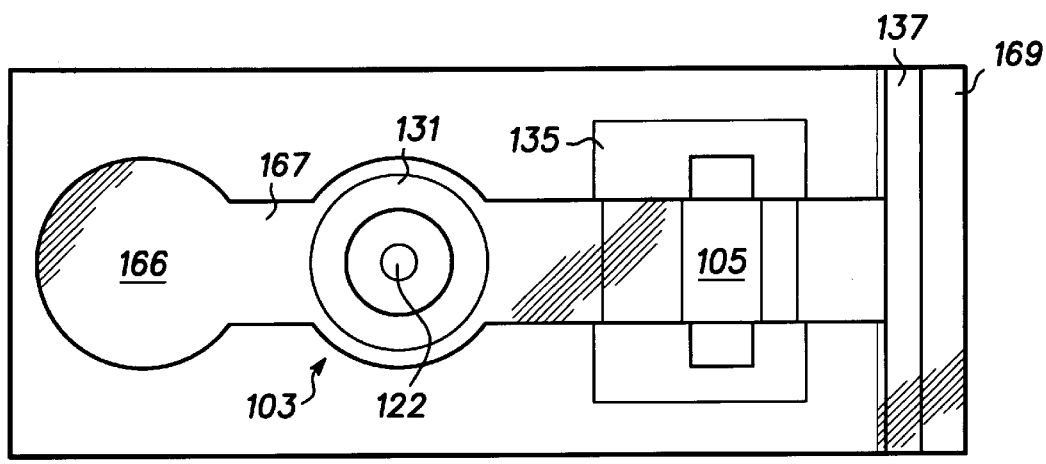
FIG. 2 is a view in top plan of the structure of FIG. 1.

It should be understood that FIG. 1 is a sectional view of VCSEL 103 and diode 105, with portions thereof broken away and shown in section to illustrate the inner construction. Also, FIG. 2 is a view in top plan illustrating the overall relationship between the various components. VCSEL 103 and diode 105 can represent one of a plurality of VCSELs that make up an array. Additionally, it should be understood that FIG. 1 has been simplified, thus purposely omitting some engineering details so as to more clearly illustrate the present invention.

For purposes of orienting the reader, a brief description of materials and methods is provided hereinbelow. VCSEL 103 and diode 105 are fabricated on any suitable substrate, such as gallium arsenide, silicon, indium gallium phosphide, or the like having surface 107. Generally, surface 107 of substrate 101 is processed to form several epitaxial layers including stack 109, active area 111 including cladding region 113, active region 115, and cladding region 117, and stack 119. Stack 109, active area 111, and stack 119 are made by any suitable epitaxial method, such as MBE, MOVPE, or the like.

Once stack 109, active area 111, and stack 119 have been formed, trenches 131, 133, 135, and 137 are formed by any suitable process or combination of processes, such as photolithography, etching, or the like. Trench 131 defines VCSEL 103 and isolates a portion of stack 119 to confine a current path through stack 109, active area 111, and stack 119. Trench 131 extends from surface 120 of stack 119 to just above active area 111. Thus, when current flows, active region 115 is activated, thereby generating light which is reflected by stacks 109 and 119 for lasing and ultimately emitted through an orifice 122.

Trench 133 defines diode 105 and isolates diode 105 from VCSEL 103 and the rest of substrate 101. Trench 133 extends from surface 120 through the various layers and into substrate 101. Diode 105 is further processed to expose a portion 145 of stack 109 by any suitable method or combination of methods such as photolithography, etching or the like, thereby exposing portion 145 to be used as an electrical contact.

It should be understood by one of ordinary skill in the art that the fabrication of trenches 131, 133, 135, and 137 is not generally accomplished as a single step but rather is achieved by using a plurality of steps. Additionally, it will be understood by one of ordinary skill in the art that sizing, i.e., widths and depths of trenches 131, 133, 135, and 137 is application specific and can range widely in accordance with specific design requirements, including but not limited to materials utilized, operating voltages and frequencies, etc.

However, by way of example only, with regard to trench 131, trench 131 has a width 150 ranging from 0.1 micron to 100 microns and a depth 151 ranging from 0.1 micron to just above cladding region 117. Trench 133 has a width 153 ranging from 0.1 micron to about 100 microns and a depth extending from surface 120 into substrate 101. Trench 135 has a width sufficient to expose a useable contact surface of stack 109 and a depth extending from surface 120 into stack 109. Trench 137 has a width 155 ranging from 0.1 micron to about 100 microns and a depth extending from surface 120 to just below active area 111 or into substrate 101.

Once trenches 131, 133, 135, and 137 have been formed, dielectric layer 121 is disposed on the exposed surfaces of the structure. Dielectric layer 121 includes any suitable dielectric material, such as nitride, oxynitride, oxide, or the like. It will be understood by one of ordinary skill in the art that disposition of dielectric layer 121 can be achieved using either an additive method, i.e., using a combination of techniques such as photolithography and deposition or a subtractive method, i.e., using a combination of techniques such as depositions, photolithography and etching, thereby patterning and positioning portions of dielectric layer 121 in their correct positions.

For example, with dielectric layer 121 being made of nitride and deposited over surface 120 after the fabrication of trenches 131, 133, 135, and 137, dielectric layer 121 is patterned with a masking material. The masking material exposes certain areas or portions of the dielectric layer. In this specific case, areas 145, 157, 159, 161, 163, and 171 of dielectric layer 121 are exposed. Once areas 145, 157, 159, 161, 163, and 171 are exposed, an etch process is done to remove exposed areas 145, 157, 159, 161, 163, and 171 of dielectric layer 121, thereby exposing portions of stacks 109 and 119.

Any suitable etch process or combination of etch processes can be used to remove areas 145, 157, 159, 161, 163 and 171 of dielectric layer 121. For example, if dielectric layer 121 is made of nitride, a dry etch, i.e., a fluorine based plasma chemistry can be used. Additionally, a wet etch, i.e., a HF solution could also be used. It will be understood by one of ordinary skill in the art that etch chemistries and techniques vary depending upon the materials involved.

Once areas 145, 157, 159, 161, 163 and 171 of stacks 109 and 119 are exposed, conductive layers 123 and 125 are disposed on substrate 101. Conductive layers 123 and 125 are formed of any suitable material, such as a metal, e.g., aluminum, gold, silver, or the like, or an alloy, e.g., aluminum/copper, gold/zinc, gold/germanium, titanium/tungsten, or the like, or doped material, e.g., doped polysilicon. Further, conductive layers 123 and 125 can be disposed on substrate 101 by any suitable method, such as sputtering, evaporation, chemical vapor deposition, or the like.

Once conductive layers 123 and 125 are disposed on substrate 101, conductive layers 123 and 125 are patterned by any suitable method as previously described with reference to dielectric layer 121. A pattern is made of a masking material which covers portions of conductive layers 123 and 125 and exposes other portions of conductive layers 123 and 125. Once conductive layers 123 and 125 are patterned with the masking material, the exposed portions of conductive layer 123 and 125 are etched, thereby removing the exposed portions of conductive layers 123 and 125, and exposing portions of dielectric layer 121.

As shown in FIG. 1, conductive portion 164 includes a conductive bonding pad 166, a conductive lead 167 and an upper terminal for VCSEL 103. Generally, conductive bonding pad 166 acts as an electrical connection for applying an external voltage to the upper terminal of VCSEL 103 and an opposite terminal of diode 105. From conductive bonding pad 166, conductive lead 167 electrically couples stack 119 of VCSEL 103 with contact 145 of stack 109.

Conductive portion 169 provides an external connection pad for electrical connections to the upper terminal of diode 105 (portion 171) and electrically connects the lower terminal of VCSEL 103 (portions 161 and 163 and stack 109) to the upper terminal of diode 105. By electrically coupling the conductive portion 164 to VCSEL 103 and portion 145, and electrically coupling conductive portion 169 to portions 159, 161, 163, and 171, diode 105 is electrically coupled in reverse parallel to VCSEL 103. By placing diode 105 in reverse parallel with VCSEL 103, a reverse biased ESD protection is achieved. In an ESD event, with the reverse biased diode 105 connected in parallel to VCSEL 103, the charge is drained off into substrate 101 through diode 105.

Figure 3:
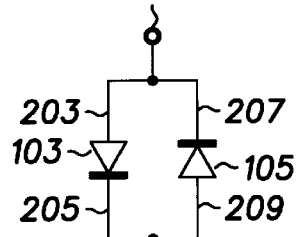
FIG. 3 is an equivalent circuit of a VCSEL coupled to a diode.

FIG. 3 is a schematic diagram of VCSEL 103 coupled to diode 105. VCSEL 103 includes electrical terminals 203 and 205 and diode 105 includes electrical terminals 207 and 209. It will be understood that diode 105 can be fabricated in a variety of embodiments but in the preferred embodiment diode 105 is a p-i-n diode. Further, depending upon materials, etc. the breakdown voltage of diode 105 can be a relatively wide range but should be at least sufficient to withstand and discharge any expected ESD events. Generally the range of breakdown voltages can be from 10s to several hundred volts. VCSEL 103 and diode 105 are electrically coupled at contacts 210 and 211. By electrically coupling VCSEL 103 with diode 105, the reverse biased ESD damage threshold of VCSEL 103 is increased to at least the level of the forward biased ESD damage threshold, which is typically at least 100–200 Volts higher. Thus, the reliability of VCSEL 103 is improved due to the decreasing likelihood of catastrophic failure of VCSEL 103 by an ESD event.

By now it should be appreciated that a novel article and method of making has been provided. A vertical cavity surface emitting laser having higher reliability, with improved performance has been described. These and other advantages result from the electrical coupling of a diode with a vertical cavity surface emitting diode. Further, the VCSEL and protective diode are formed during the same process so that no additional steps or labor is required and the diode uses very little extra chip real estate so that it is very inexpensive to integrate with the VCSEL.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser having electro-static discharge protection comprising:

a vertical cavity surface emitting laser having a first stack of distributed Bragg reflectors, a second stack of distributed Bragg reflectors, an active region sandwiched therebetween the first and second stacks of distributed Bragg reflectors, a first electrical terminal, and a second electrical terminal; and a diode having a first stack of distributed Bragg reflectors, a second stack of distributed Bragg reflectors, an active region sandwiched therebetween the first and second stacks of distributed Bragg reflectors, a third electrical terminal and a fourth electrical terminal, where the first electrical terminal and the third electrical terminal are coupled together and the second electrical terminal and the fourth electrical terminal are coupled together, the vertical cavity surface emitting laser and the diode integrated on a common chip, and coupled together in reverse parallel thus providing protection against electrostatic discharge damage to the vertical cavity surface emitting laser.

2. A semiconductor laser having electro-static discharge protection as claimed in claim 1 wherein the diode is a p-i-n diode.

3. A semiconductor laser having electro-static discharge protection as claimed in claim 2 wherein the p-i-n diode has a breakdown voltage between 10–20 V.

4. A semiconductor laser having electro-static discharge protection as claimed in claim 2 wherein the p-i-n diode has a second breakdown voltage of more than 100 V.

5. A vertical cavity surface emitting laser comprising:

a substrate;

a first stack of distributed Bragg reflectors disposed on the substrate, the first stack of distributed Bragg reflectors including a plurality of alternating layers;

a first active area overlying the first stack of distributed Bragg reflectors;

a second stack of distributed Bragg reflectors having a surface overlying the first active area, the second stack of distributed Bragg reflectors including a plurality of alternating layers;

a first trench having a first width and a first depth, wherein the first depth of the first trench extends into a portion of the second stack of distributed Bragg reflectors and defines a vertical cavity surface emitting laser;

a second trench with a second width and a second depth, wherein the second depth of the second trench extends into a portion of the substrate, the second trench defines and isolates a diode;

a third trench having a third width and a third depth, wherein the third trench is located inside the second trench and extends into contact with the first stack of distributed Bragg reflectors;

a fourth trench having a fourth width and a fourth depth, wherein the fourth depth extends into contact with the first stack of distributed Bragg reflectors;

a dielectric layer covering the surface of the second stack of distributed Bragg reflectors, the dielectric layer defining an opening adjacent the first trench region exposing a portion of the second stack of distributed Bragg reflectors, an opening exposing a portion of the first stack of distributed Bragg reflectors adjacent the active area, and an opening exposing a contact through the second stack of distributed Bragg reflectors of the diode; and a first metal layer electrically connecting the exposed portion of the second stack of distributed Bragg reflectors adjacent the first trench with the portion of the first stack of distributed Bragg reflectors adjacent the active area in the second trench and a second metal layer electrically connecting the exposed portion of the first stack of distributed Bragg reflectors in the fourth trench with the exposed portion of the second stack of distributed Bragg reflectors of the diode.

* * * * *